United States Patent
Lee et al.

(10) Patent No.: US 6,696,739 B2
(45) Date of Patent: Feb. 24, 2004

(54) HIGH EFFICIENT PN JUNCTION SOLAR CELL

(75) Inventors: Eun-Joo Lee, Seoul (KR); Dong-Seop Kim, Seoul (KR); Soo-Hong Lee, Suwon (KR)

(73) Assignee: Samsung SDI Co., Ltd., Suwon-si (KR)

( * ) Notice: Subject to any disclaimer, the term of this patent is extended or adjusted under 35 U.S.C. 154(b) by 83 days.

(21) Appl. No.: 10/029,977

(22) Filed: Dec. 31, 2001

(65) Prior Publication Data

US 2002/0084503 A1 Jul. 4, 2002

(30) Foreign Application Priority Data

Jan. 3, 2001 (KR) ............................................ 2001-253

(51) Int. Cl.[7] .......................... H01L 21/00; H01L 31/00
(52) U.S. Cl. ......................... 257/457; 257/456; 438/98
(58) Field of Search ............................. 438/56, 57, 90, 438/98; 136/89, 256; 427/74, 75, 89, 91; 357/67; 204/38; 117/217; 257/456, 457

(56) References Cited

U.S. PATENT DOCUMENTS

| | | | |
|---|---|---|---|
| 3,993,533 A | * | 11/1976 | Milnes et al. ................. 117/88 |
| 4,082,568 A | | 4/1978 | Lindmayer |
| 4,124,455 A | | 11/1978 | Lindmayer |
| 4,278,704 A | | 7/1981 | Williams |
| 4,586,988 A | * | 5/1986 | Nath et al. ................... 205/123 |
| 4,791,469 A | * | 12/1988 | Ohmi et al. .................. 257/462 |
| 4,888,062 A | * | 12/1989 | Nakagawa et al. ......... 136/258 |
| 5,593,901 A | * | 1/1997 | Oswald et al. ................ 438/80 |
| 5,928,438 A | * | 7/1999 | Salami et al. ............... 136/255 |
| 2001/0050103 A1 | * | 12/2001 | Washio ........................ 136/256 |

FOREIGN PATENT DOCUMENTS

JP 06-283736 * 10/1994 ............ H01L/31/04

OTHER PUBLICATIONS

Microchip Fabrication, Fourth Edition, Copyright 2000, pp. 402–403, by Peter Van Zant.*

* cited by examiner

Primary Examiner—Carl Whitehead, Jr.
Assistant Examiner—William Vesperman
(74) Attorney, Agent, or Firm—Robert E. Bushnell, Esq.

(57) ABSTRACT

A pn junction solar cell includes a pn junction structure including a p-type and a n-type semiconducting layer, a front contact electrode formed on the front surface of the pn junction structure through a contact pattern having a constant width, and a rear contact electrode formed on a rear surface of the pn structure. The front contact electrode is reduced in its width as it goes away from a terminal.

10 Claims, 3 Drawing Sheets

HIGH EFFICIENT PN JUNCTION SOLAR CELL

CLAIM OF PRIORITY

This application makes reference to, incorporates the same herein, and claims all benefits accruing under 35 U.S.C. §119 from an application for SOLAR CELL AND METHOD FOR MANUFACTURING THE SAME earlier filed in the Korean Industrial Property Office on Jan. 3, 2001 and there duly assigned Serial No. 2001-253.

BACKGROUND OF THE INVENTION

1. Field of the Invention

The present invention relates to a solar cell and more particularly a solar cell having high efficiency.

2. Description of the Related Art

A pn junction solar cell includes a junction of a p-type semiconductor and an n-type semiconductor. In the cell, electron-holepairs are generated by photons. The generated electrons and holes respectively move toward the p-type and n-type semiconductors, and then accumulated in two contacts. When light shining on the solar cell produces both a current and a voltage, the light-generated current and voltage can be used as electric power.

In a solar cell, n-type and p-type impurities are doped on the front and rear surfaces of a silicon substrate for making the p-n junction and contacts are formed on both surfaces. To fabricate such a solar cell, oxide layers are formed and etched with predetermined patterns by costly photolithography process on each surface of a Si substrate, and impurities are doped through the patterned area. Then, contact layers are formed on the patterned area.

U.S. Pat. No. 4,082,568 issued to Lindmayer for Solar Cell with Multiple-metal Contacts and U.S. Pat. No. 4,124,455 issued to Lindmayer for Method of Making Solar Cell with Multiple-metal Contacts disclose a technique for fabricating such a solar cell, in which a front contact is formed of a multi-layered metal pattern including Ti-based metal and Pd-based metal to prevent conductive material of the front contact from diffusing into the silicon substrate.

U.S. Pat. No. 4,278,704 issued to Williams for Method for Forming an Electrical Contact to a Solar Cell discloses a method of forming an electrical contact of a solar cell by using a silicide to lower the contact resistance.

The multi-layered metal pattern including Ti-based metal and Pd-based metal is formed by evaporation method accompanying photolithography in which the multi-layered metal deposited on the portion except the contact area is eliminated. The photolithography is costly and not appropriate for mass production. In addition, the Ti-based metal and Pd-based metal is costly and the formation of the multi-layered metal pattern is complicated.

Furthermore, a conventional front contact includes a common electrode connected with a contact pad, and finger electrodes extending from the common electrode with uniform width. The light absorption rate of the solar cell is reduced as much as the area of the front contact. That is, the greater the front contact occupies an area, the more the shading loss occurs.

Japanese Patent Laid-Open No. 1994-283736 issued to Shibuya et al. for a Solar Cell discloses a solar cell having a front electrode of which the cross-sectional areas become larger as it goes from an edge to a terminal. However, the front electrode being consisted of Ti/Pd/Ag is formed by costly photolithography process and lift-off process. In addition, the front contact pattern and the front electrode are manufactured by photolithography process, and therefore they have the same shape.

Therefore, there is a need for a solar cell that can improve the energy conversion efficiency by minimizing the shading loss, while reducing the manufacturing costs.

SUMMARY OF THE INVENTION

It is therefore an objective of the present invention to provide a solar cell that can be fabricated by simple manufacturing process and have the minimized manufacturing costs.

It is another objective of the present invention to provide a solar cell showing the improved energy conversion efficiency by minimizing the shading loss, while reducing the manufacturing costs.

To meet the above and other objectives, the present invention provides a pn junction solar cell including a pn junction structure including a p-type and an n-type semiconducting layer, a front contact electrode formed on the front surface of the pn junction structure, the front contact electrode being reduced in a width as it goes away from a terminal, and a rear contact electrode formed on a rear surface of the pn structure. According to a feature of the present invention, at least one of the p-type and n-type semiconducting layer is formed of Si.

According to another feature of the present invention, a plurality of the front contact electrode make branches being arranged in an identical direction, and the branches are collected at a common electrode which electrically interconnects proximal ends of the branches and a front electrode terminal.

According to yet another feature of the present invention, a shape of the front contact electrode is a triangle.

According to still yet another feature of the present invention, the solar cell may further include a buffer formed between the front surface of the pn junction structure and the front contact electrode. According to still yet another feature of the present invention, the buffer is formed of a material selected from the group including Ni, Cr, Co and Ti.

According to still yet another feature of the present invention, the buffer includes an interfacial silicide layer.

According to still yet another feature of the present invention, the front and rear contact electrodes are formed of Cu or Ag.

According to still yet another feature of the present invention, a solar cell may further include a Ti/Pd (Ti or Pd or both Ti and Pd) layer formed between the rear contact electrode and rear surface.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Turning now to the drawings, first-conductive-type or second-conductive-type indicate p-type or n-type, and the expression of p-type or n-type is used for convenience of description.

Figure 1:
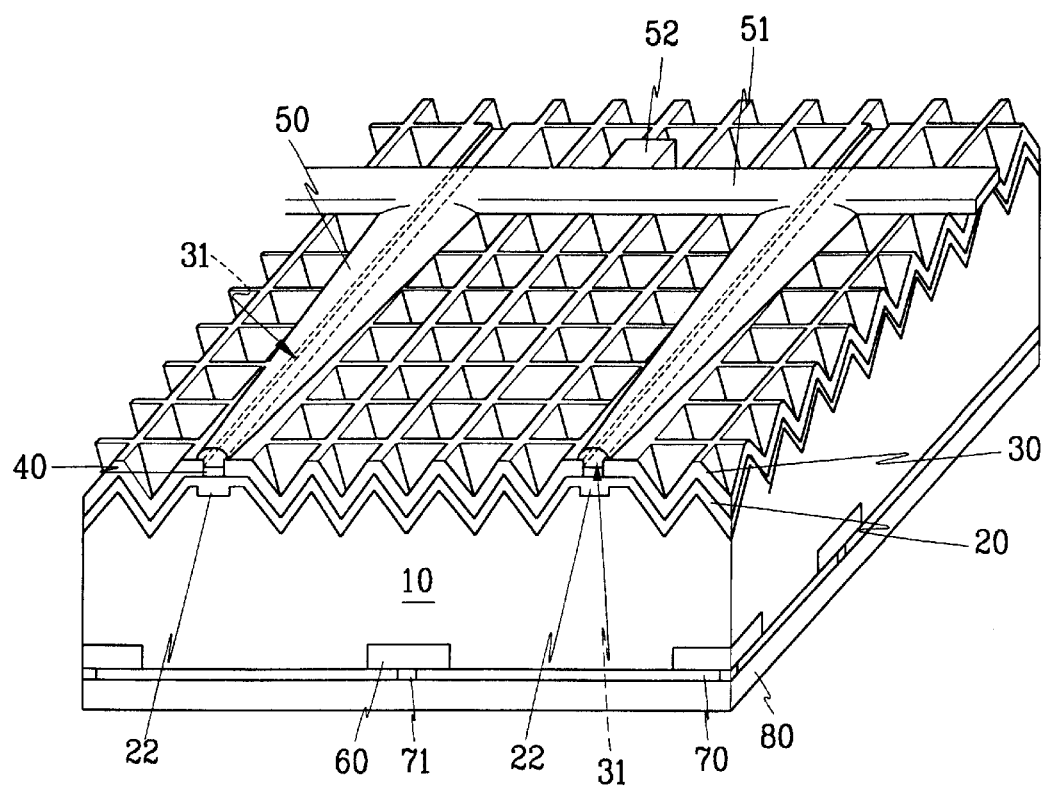
FIG. 1 is a perspective view of a solar cell according to a preferred embodiment of the present invention.

FIG. 1 shows a pn junction solar cell according to a preferred embodiment of the present invention.

The inventive pn junction solar cell includes a first-conductive-type (e.g., p-type) silicon substrate 10, a front surface of which is patterned to have a plurality of reverse-pyramidal grooves of about 8 $\mu$m (micrometers) depth that enhance the light absorption compared with a flat surface.

On the front surface of the p-type Si substrate 10, second-conductive-type (e.g., n-type) impurities such as phosphorus (P) are doped with a doping concentration of about $10^{17}$ cm$^{-3}$ so as to form an n-layer 20 of about 0.5~1 $\mu$m thick. As a result, a pn junction structure is obtained.

In addition, heavily doped layer, that is, n$^+$-layer 22 that is an emitter area having a doping concentration of about $10^{19}$ cm$^{-3}$ (centimeters cubed) and a width of about 20 $\mu$m, is formed in portions of the n-layer 20.

A front oxide layer 30 of about 2000 Å (Angstroms) thick is formed on the n-layer 20.

Front contact patterns 31 with a constant width of about 10 $\mu$m are formed on the front oxide layer 30 to expose the n$^+$-layer 22.

A front contact electrode 50 is formed on the front oxide layer 30 such that it can electrically connect with the n$^+$-layer 22 through the front contact patterns 31. The front contact electrode 50 collects and transmits light-generated carriers in the cell to an outer terminal. The front contact electrode 50 formed of conductive material such as Cu, Ag, or combination of Cu and Ag is formed on the contact patterns by an electroplating method or electroless plating method appropriate for plating a predetermined area.

At this point, the front contact electrode 50 is formed in a tapered semi-cylindrical shape. That is, the width of the front contact electrode 50 is reduced or increased on its longitudinal direction.

The n$^+$-layer 22 reduces the resistance between the front contact electrode 50 and the silicon substrate 10.

A buffer 40 of about 1000 Å thick is further formed between the n$^+$-layer 22 and the front contact electrode 50 so as to prevent the low resistance conductive material of the front contact electrode 50 from diffusing into the silicon substrate 10 and to improve the contact characteristic. Preferably, the buffer 40 is formed of a material selected from the group including Ni, Cr, Co, Ti, or any combination of Ni, Cr, Co and Ti and its interfacial silicide.

On the rear surface of the silicon substrate 10, a rear oxide layer 70 of about 2000 Å thick is formed. p$^+$-layer 60 having a doping concentration of $10^{19}$ cm$^{-3}$ and a width of about 20 $\mu$m is formed in portions of the rear surface of the silicon substrate 10.

Rear contact patterns 71 of about 10 $\mu$m width are formed on the rear oxide layer 70 to expose the p$^+$-layer 60.

A rear contact electrode 80 formed of a low resistance conductive material such as Cu or Ag is formed on the rear oxide layer 70 such that it can electrically contact the p$^+$-layer 60 through the rear contact patterns 71.

Here, the p$^+$-layer 60 acts as back surface field (BSF) which reflects electrons and accelerates the movement of the holes from heavily doped region to bulk region, thereby increasing open-circuit voltage of the cell.

In the above-described description, it should be noted that the front and rear contact electrodes 50 and 80 could be varied in their shapes.

A plurality of the front contact electrode 50 make branches being arranged in an identical direction, and the branches are collected at a common electrode 51 which electrically interconnects proximal ends of the branches and a front electrode terminal 52.

The width of each front contact electrode 50 is reduced from about 60 $\mu$m at the proximal end to about 10 $\mu$m at the distal end to the common electrode 51 such that a whole shape of the front contact electrode 50 becomes a triangle. Accordingly, as the whole area of the front contact electrode 50 can be reduced, the shading loss and the power loss are minimized, and as a result, the energy conversion efficiency is maximized.

A method for fabricating the solar cell according to a preferred embodiment will be described more in detail hereinafter with reference to FIGS. 1 and 2.

First, the reverse pyramidal groove pattern of about 8 $\mu$m depth is formed on the front surface of the silicon substrate 10 through a wet-etching process. That is, a protective oxide layer (not shown) is first formed on the silicon substrate 10, and a photoresist pattern (not shown) is formed on the oxide layer, after which the oxide layer is etched using the photoresist pattern as a mask. Then, after removing the photoresist pattern, the front surface of the silicon substrate is textured using the etched oxide layer as a mask to form the reverse-pyramidal groove pattern on the silicon substrate 10.

Next, after removing the oxide layer, the n-type impurities such as phosphorus (P) are doped at doping concentration of $10^{17}$ cm$^{-3}$ on the entire front surface of the silicon substrate so as to define the n-layer 20 of about 0.5~1 $\mu$m thick. As phosphorus doping source, POCl$_3$ or P$_2$O$_5$ may be used.

Then, the front and rear oxide layers 30 and 70 of about 2000 Å are formed on the front and rear surfaces of the substrate 10 through thermal-oxidation process.

After the above, the front contact patterns 31 of about 10 $\mu$m width for exposing portions of the n-layer 20 are formed on the front oxide layer 30 by patterning the front oxide layer 30. Through the exposed contact patterns, n-type impurities are deposited and diffused in the n-layer 20, thereby forming the n$^+$-layer 22 with a doping concentration of about $10^{19}$ cm$^{-3}$ and about 20 $\mu$m width.

Next, the buffer 40 of about 1000 Å thick is formed by depositing material selected from the group including Ni, Cr, Co, Ti, and any combination of Ni, Cr, Co and Ti through an electroless process, and heating the layer at a temperature of about 300–400° C. (Celsius) to form an interfacial silicide by the reaction with the Si substrate.

After the above, the rear contact patterns 71 of about 10 $\mu$m width for exposing portions of the substrate 10 are formed on the rear oxide layer 70 by patterning the rear oxide layer 70. Through the exposed contact patterns, p-type impurities such as Al are deposited and diffused in the substrate 10, thereby forming the p$^+$-layer 60 with a doping concentration of about $10^{19}$ cm$^{-3}$ and about 20 $\mu$m width.

Next, the front and rear contact electrodes 50 and 80 formed of Cu, Ag, or combination of Cu and Ag are respectively formed on the oxide layers 30 and 70 by plating conductive metal on the oxide layer by an electroless plating method or electroplating method. The electroless plating and electroplating methods are capable of selective plating, and therefore appropriate for mass production and make the fabrication cost lower.

Figure 2:
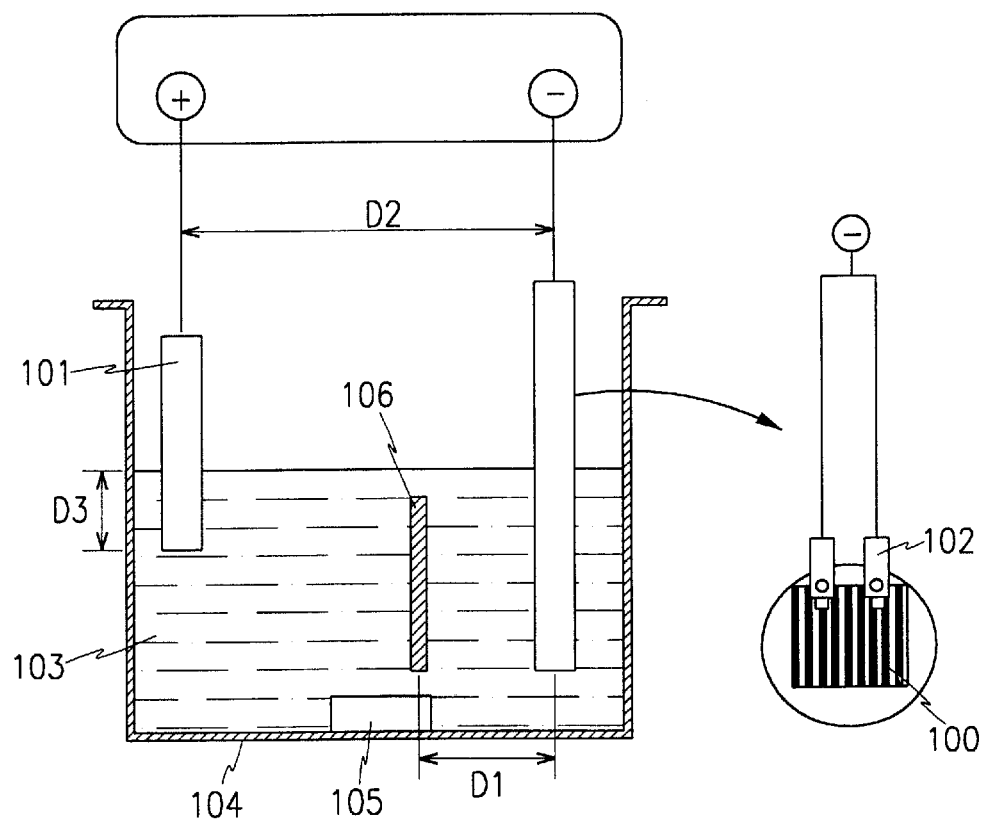
FIG. 2 is a sectional view showing a Cu electroplating process to manufacture a front and rear contact electrode of a solar cell according to a preferred embodiment of the present invention.

For example, as seen in FIG. 2, the front contact electrode in a 45 cm$^2$ solar cell 100 is formed by Cu electroplating method. In Cu electroplating method, Cu 101 is contacted with a (+) pole and a front electrode terminal of a solar cell 100 is contacted with a (−) pole using a sample holder 102. Electrolysis solution 103 in an electroplating bath 104 is AgCN solution, or copper sulfate solution including 180–240 g/l of $CuSO_4$, 45–60 g/l (gram per liter) of $H_2SO_4$, 20–80 mg/l (milligram per liter) of $Cl^-$ and additives, and is kept in room temperature during the plating process. An air bubbler 105 is installed in the electroplating bath 104.

An applied current is constant with a current density of 2–10 A/dm$^2$. Barrier 106 having an area of ½ of the total cell area is installed in front of the lower part of the cell 100 at distance D1 of 2–10 cm to the cell. The distance D2 between the both poles is controlled to being about 5–10 cm. The depth D3 of Cu 101 being dipped in the electrolysis solution 103, that is the distance from the surface of the electrolysis solution 103 to the lower plane of the Cu 101, is controlled to being about 1–4 cm. The total surface area of the both poles is decided to being proportional to the surface of the front electrode to be plated.

During Cu plating by electroplating method as described above, Cu plating is concentrated on the upper part of the cell, because the barrier 106 shields the Cu plating on the lower part of the cell. Therefore, the front contact electrode manufactured by Cu plating has a width decreasing from about 70 μm at the proximal end to about 20 μm at the distal end to the common electrode such that a whole shape of the front contact electrode becomes a triangle.

As described above, since the front contact electrode is designed to decrease in its diameter as it goes away from the terminal, the shading loss can be minimized. In addition, since the front and rear contact electrodes 50 and 80 are simultaneously formed, the manufacturing process can be simplified.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

Figure 3:
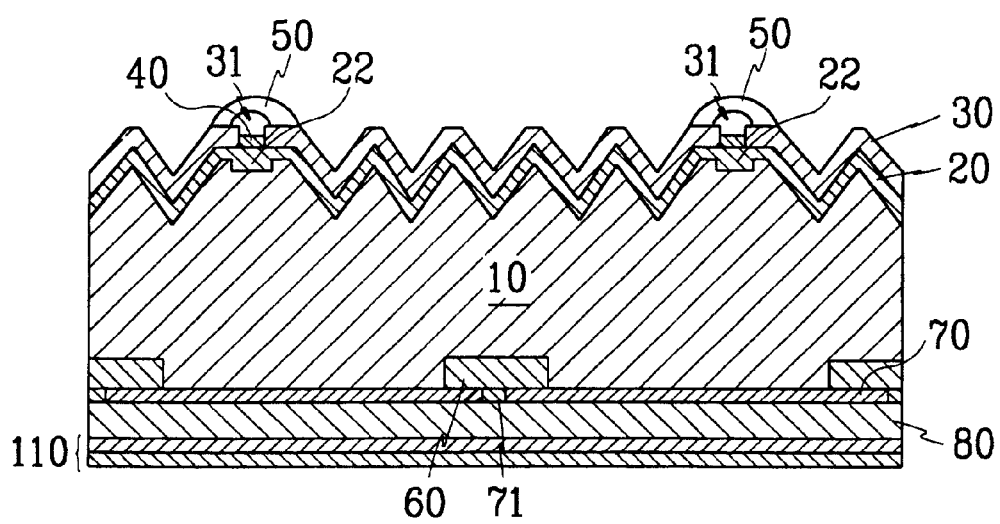
FIG. 3 is a sectional view of a solar cell according to another preferred embodiment of the present invention.

For example, as seen in FIG. 3, Ti and Pd double layer 110 can be additionally formed on the rear contact electrode 80 as a rear buffer. That is, after forming the rear contact electrode 80, the rear buffer can be formed on the rear contact electrode 80 such that it contacts the p$^+$-layer 60. Here, Ti single layer or Pd single layer can be replaced by the Ti and Pd double layer 110. Alternate embodiments having conductivity types opposite from that of the embodiments of FIGS. 1 and 3 are also possible.

What is claimed is:

1. A pn junction solar cell, comprising:
    a pn junction structure comprising a p-type and an n-type semiconductor layer;
    a front contact electrode formed on a front surface of the pn junction structure through a contact pattern having a constant width as the contact pattern goes away from a terminal, the front contact electrode being reduced in a width as the front contact electrode goes away from the terminal; and
    a rear contact electrode formed on a rear surface of the pn junction structure.

2. The pn junction solar cell of claim 1, further comprised of at least one of the p-type and a n-type semiconductor layer being formed of Si.

3. The pn junction solar cell of claim 1, further comprised of a plurality of the front contact electrode forming branches being arranged in an identical direction, and the branches being collected at a common electrode which electrically interconnects proximal ends of the branches and a front electrode terminal.

4. The pn junction solar cell of claim 1, further comprised of a shape of the front contact electrode being a triangle.

5. The pn junction solar cell of claim 1, further comprising a buffer formed between the front surface of the pn junction structure and the front contact electrode.

6. The pn junction solar cell of claim 5, with the buffer being formed of a material selected from the group consisting essentially of Ni, Cr, Co, Ti, and a mixture thereof.

7. The pn junction solar cell of claim 6, with the buffer comprising an interfacial silicide layer.

8. The pn junction solar cell of claim 1, further comprised of the front and rear contact electrodes being formed of a material selected from the group consisting essentially of Cu, Ag, and a mixture thereof.

9. The pn junction solar cell of claim 1, further comprised of the front and rear contact electrodes being formed by an electroplating method or electroless plating method.

10. The pn junction solar cell of claim 1, further comprising a metal layer formed between the rear contact electrode and rear surface, the metal layer being selected from the group consisting essentially of Ti single layer, Pd single layer, and Ti and Pd double layer.

* * * * *